United States Patent
Reusswig et al.

(10) Patent No.: US 10,996,862 B2
(45) Date of Patent: May 4, 2021

(54) ADAPTIVE READ TRIM FOR SECOND READ DATA RETENTION

(71) Applicant: Western Digital Technologies, Inc., San Jose, CA (US)

(72) Inventors: Phil Reusswig, San Jose, CA (US); Mohsen Purahmad, San Jose, CA (US); Sahil Sharma, San Jose, CA (US); Rohit Sehgal, San Jose, CA (US); Niles Yang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/443,011

(22) Filed: Jun. 17, 2019

(65) Prior Publication Data

US 2020/0393973 A1 Dec. 17, 2020

(51) Int. Cl.
*G06F 3/06* (2006.01)
*G11C 16/34* (2006.01)
*G11C 16/32* (2006.01)
*G11C 16/26* (2006.01)
*G11C 16/04* (2006.01)
*G06F 12/02* (2006.01)

(52) U.S. Cl.
CPC .......... *G06F 3/0616* (2013.01); *G06F 3/0659* (2013.01); *G06F 3/0679* (2013.01)

(58) Field of Classification Search
CPC .......... G06F 11/07; G06F 11/14; G11C 29/50
See application file for complete search history.

(56) References Cited

U.S. PATENT DOCUMENTS

| | | | |
|---|---|---|---|
| 10,089,235 B1 * | 10/2018 | Taylor ................ | G06F 12/0871 |
| 2010/0172180 A1 * | 7/2010 | Paley ................ | G06F 12/0246 |
| | | | 365/185.12 |
| 2010/0174847 A1 * | 7/2010 | Paley ................ | G06F 12/0246 |
| | | | 711/103 |
| 2015/0262694 A1 * | 9/2015 | Seo ................ | G06F 12/00 |
| | | | 714/764 |
| 2018/0046527 A1 * | 2/2018 | Reusswig ............ | G06F 11/004 |
| 2018/0217751 A1 * | 8/2018 | Agarwal ............ | G11C 16/3422 |

* cited by examiner

*Primary Examiner* — Getente A Yimer
(74) *Attorney, Agent, or Firm* — Morgan, Lewis & Bockius LLP

(57) ABSTRACT

A data storage system performs operations including determining an endurance level of a block of memory cells; adjusting a read performance profile for the block of memory cells based on the determined endurance level; receiving a data read command specifying data to be read from a particular memory cell of the block of memory cells; and in response to the data read command, performing a read operation on the particular memory cell using the adjusted read performance profile.

17 Claims, 7 Drawing Sheets

Read Trim Table
500

| Adaptive Read Trim Group | EC Range | Trim |
|---|---|---|
| 0 | 1, 50K | RR4 = X, ... |
| ... | ... | ... |
| N | 75K, 100K | RR4 = X+2, ... |

Figure 5

ADAPTIVE READ TRIM FOR SECOND READ DATA RETENTION

TECHNICAL FIELD

The present disclosure relates to memory systems, and in particular, to adaptive read performance for memory cells as they advance through various stages of their life cycle.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

SUMMARY

Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to reduce bit error rate in first read scenarios.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 5 is a table including example adaptive read trim values in accordance with some embodiments.

Figure 1:
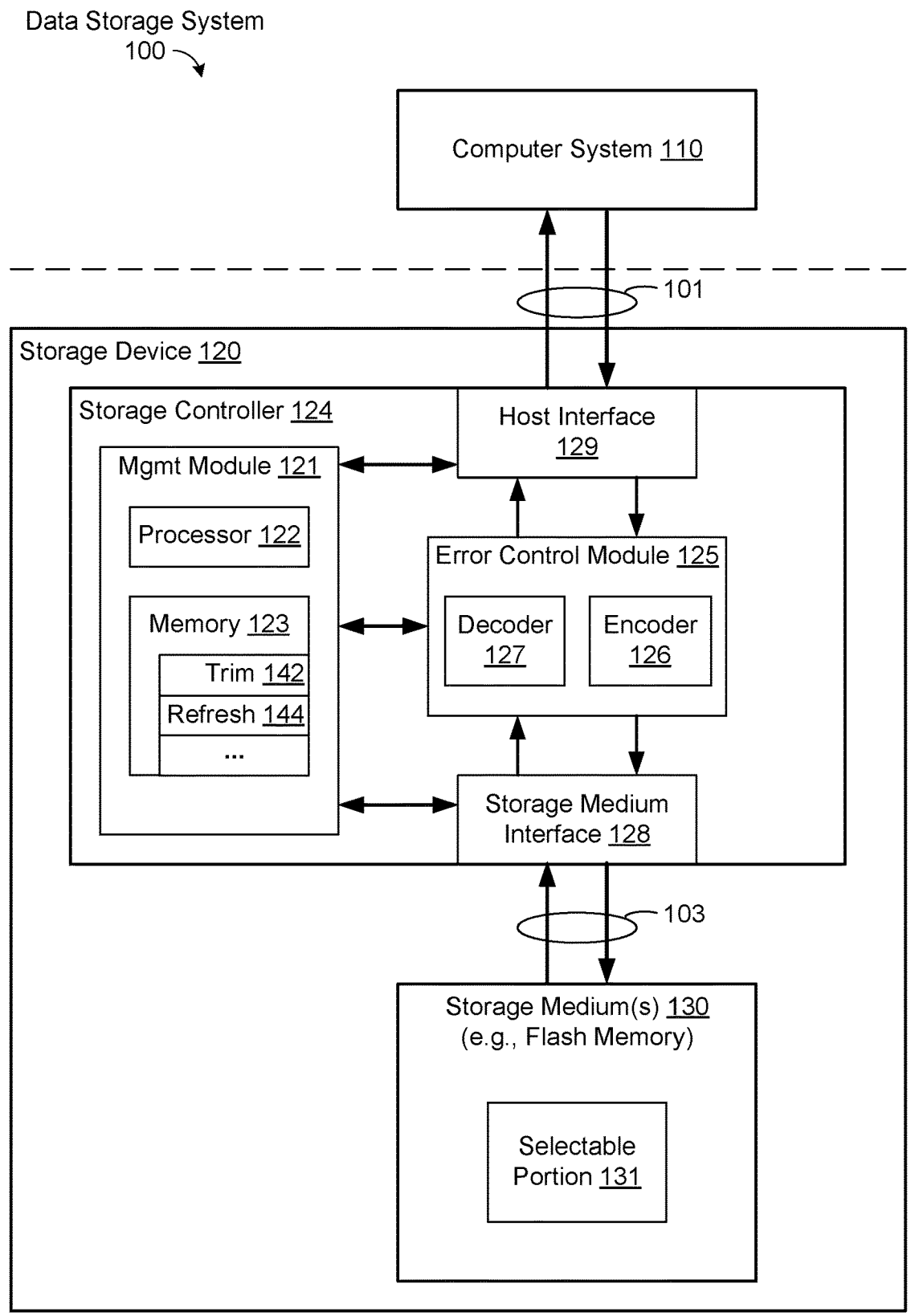
FIG. 1 is a block diagram of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that read data from memory cells using adaptive read trim values optimized for performance and data retention.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage system 100 includes data processing system (alternatively referred to herein as a computer system or host) 110, and storage device 120.

Computer system 110 is coupled to storage device 120 through data connections 101. In various implementations, computer system 110 includes storage device 120 as a component. Generally, computer system 110 includes any suitable computer device, such as a computer, a laptop computer, a tablet device, a netbook, an internet kiosk, a personal digital assistant, a mobile phone, a smart phone, a gaming device, a computer server, or any other computing device. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage device 120 includes one or more storage mediums 130 coupled to storage controller 124 through data connections 103. In various implementations, storage controller 124 and storage medium(s) 130 are included in the same device (e.g., storage device 120) as constituent components thereof, while in other embodiments, storage controller 124 and storage medium(s) 130 are, or are in, separate devices. Each storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally or alternatively, flash memory devices can also be configured for relatively smaller-scale applications such as personal flash drives or hard-disk replacements for personal, laptop and tablet computers. In some implementations, a storage medium 130 comprises one or more flash memory devices. In some implementations, a storage medium 130 comprises at least one of NAND-type flash memory and/or NOR-type flash memory.

Storage mediums are often divided into a number of addressable and individually selectable blocks, such as selectable portion 131. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those ranges may be extended upward or downward, and/or shrink or expand depending on a particular application. In some embodiments, each page stores one or more codewords, where a codeword is the smallest unit of data that is separately encoded and decoded by the encoder and decoder mechanisms of a particular device.

In some implementations, storage controller 124 includes management module 121, error control module 125, storage medium interface (I/O) 128 and host interface 129. Host interface 129 couples storage device 120 and its storage controller 124 to one or more computer systems 110, while storage medium interface 128 couples storage controller 124 to storage medium(s) 130. In some implementations, storage controller 124 includes various additional features that have not been illustrated for the sake of brevity, and so as not to obscure more pertinent features of the example implementations disclosed herein, and that a different arrangement of features may be possible.

Host interface 129 typically includes data buffers (not shown) to buffer data being received and transmitted by storage device 120, via data connections 101. Similarly, storage medium I/O 128 provides an interface to storage medium(s) 130 though data connections 103. In some implementations, storage medium interface 128 includes read and write circuitry.

In some implementations, management module 121 includes one or more processors 122. However, in some implementations, processor 122 is shared by one or more components within, and in some cases, beyond the function of storage controller 124. Management module 121 is coupled to host interface 129, error control module 125 and storage medium I/O 128 in order to coordinate the operation of these components.

In some implementations, management module 121 includes trim module 142, for setting the read trim and/or write trim for one or more of the selectable portions 131 of storage medium(s) 130. As used herein, and as described in further detail herein, read trim and write trim may describe the characteristics (e.g., read time, or write time) of a read or write operation performed on memory. However, in some implementations, trim module 142 is shared by one or more components within, and in some cases, beyond the function of storage controller 124. In some implementations, trim module 142 is included in storage medium(s) 130.

In some implementations, management module 121 includes read refresh module 144, for coordinating read refresh commands for selectable portions 131 of storage medium(s) 130. However, in some implementations, read refresh module 144 is shared by one or more components within, and in some cases, beyond the function of storage controller 124. In some implementations, read refresh module 144 is included in storage medium(s) 130.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in a storage medium 130. When the encoded data is read from the storage medium 130, decoder 127 applies a decoding process to recover the data, and correct errors within the error correcting capability of the error control code. Various error control codes have different error detection and correction capacities, and particular codes are selected for various applications.

Management module 121 typically includes one or more processors 122 (sometimes referred to herein as CPUs, processing units, hardware processors, processors, microprocessors or microcontrollers) for executing modules, programs and/or instructions stored in memory and thereby performing processing operations. Management module 121 also includes memory 123 (sometimes referred to herein as controller memory), and one or more communication buses for interconnecting these components. Communication buses optionally include circuitry (sometimes called a chipset) that interconnects and controls communications between system components. Management module 121 is coupled by communication buses to storage medium interface 128, error control module 125, and host interface 129. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the following programs, modules, and data structures, or a subset or superset thereof:

command module (not shown), sometimes referred to as an interface module, for receiving or accessing a host command specifying an operation to be performed and a logical or physical address corresponding to a selectable portion 131 of storage medium 130 within the storage device 120;

data read module (not shown) for reading data from storage medium 130;

data write module (not shown) for writing data to storage medium 130;

data erase module (not shown) for erasing data in storage medium 130;

trim module 142, for setting the read trim and/or write trim for selectable portions 131 of storage medium(s) 130; and read refresh module 144, for coordinating read refresh commands for selectable portions 131 of storage medium(s) 130.

Further information regarding the modules and data structures listed above is provided in the following discussions. Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 123 may store a subset of the modules and data structures identified above. Furthermore, memory 123 may store additional modules and data structures not described above. In some embodiments, the programs, modules, and data structures stored in memory 123, or the non-transitory computer readable storage medium of memory 123, provide instructions for implementing any of the methods described below. Stated another way, the programs or modules stored in memory 123, when executed by the one or more processors 122, cause storage device 120 to perform any of the methods described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

Figure 2:
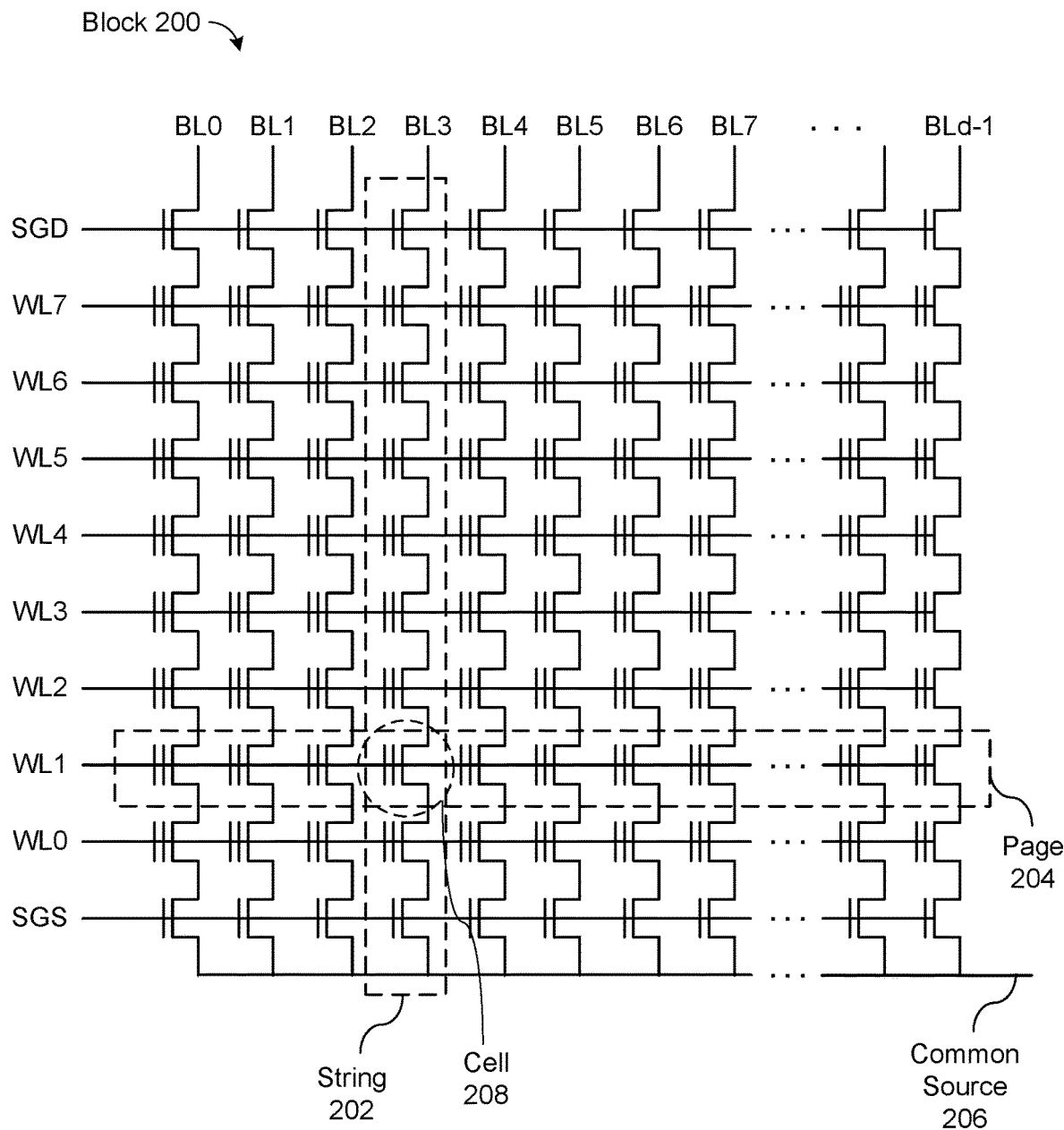
FIG. 2 is a diagram of a memory cell array in the storage medium of a storage device in accordance with some embodiments.

FIG. 2 depicts an example block 200 of a memory cell array including selectable portions 131 (FIG. 1) of storage medium 130. In this example, the memory cell array is configured as a NAND array. The depicted configuration is one among many possible configurations, and various other configurations (e.g., NOR array, 3D NAND, and so forth) have not been illustrated for the sake of brevity, and so as not to obscure more pertinent aspects of the example implementations disclosed herein.

In the example array, strings 202 (columns) are the smallest readable units and may be comprised of 32 or 64 memory cells. Strings may comprise other numbers of memory cells (e.g., more than 64, less than 32, or between 32 and 64), depending on the application. All strings in the array are connected at one end to a common source line 206 and at the other end to a bit line (e.g., BL3). Each string also contains two control transistors in series with the memory cells. String and ground select transistors are connected to the string select line (SGD) and ground select line (SGS), respectively.

In the example array, pages 204 (rows) share the same word line and are the smallest programmable units. They may be comprised of at least 32,768 (32K), 64K, or 128K memory cells. Pages may comprise other numbers of memory cells (e.g., more than 128K, less than 32K, or between 32K and 128K), depending on the application. Typically, page sizes are referred to as 2K, 4K, 8K, and so forth. This signifies the page size in bytes. So if the page size has 32,768 memory cells (bits), this equates to 4,096 (4K) bytes.

In the example array, block 200 is a two-dimensional matrix comprised of strings (columns) and pages (rows). The total number of bits in a block can be calculated by multiplying the number of strings by the number of pages. Depending on the memory operation to be carried out (e.g., read, program, erase), a selectable portion 131 of storage medium 130 includes a single page, a single string, or a single block.

Figure 4A:
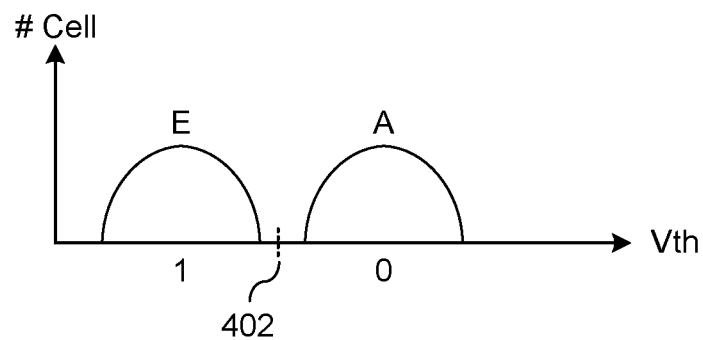
FIGS. 4A-4B are graphs showing threshold voltage distributions of example memory cells, in accordance with some embodiments.

The memory cells in the memory array may have a threshold voltage Vth included in the distribution of FIG. 4A. FIG. 4A shows a cell distribution in a single-level cell (SLC) memory in which each cell is programmed by one bit. For an SLC flash memory, each cell of the array of FIG. 2 has a threshold voltage that is included in one of an erase state E and a program state A according to a value of programmed data, as shown in FIG. 4A. However, the embodiments described herein are not limited to this configuration. For instance, each cell may be programmed by two bits (multi-level cell, referred to as MLC), three bits (triple level cell, referred to as TLC), or more than three bits, or various cells in an array may be programmed by different numbers of bits, depending on the application.

Referring back to FIG. 2, reading the state of a memory cell (e.g., 208) requires discriminating voltage threshold levels of the cell, irrespective of the voltage threshold levels of all other cells in the string. To accomplish this, the string (e.g., 202) is connected to the sensing circuit (e.g., select lines SGD and SGS are high), and a particular bit line (e.g., BL3) is biased; therefore, a current can flow (e.g., through string 202) to the (grounded) source line. Unselected cells (e.g., the cells coupled to WL0 and WL2 through WL7) are placed in a pass-transistor mode, biasing their word lines at a pass voltage larger than the maximum threshold voltage Vth. The actual read operation is then performed by applying a read voltage (e.g., to WL1), sensing the cell current through the string (BL3) of cells, and comparing the sensed current against fixed reference values to assess the corresponding binary code. The operation is performed more than one time for MLC and TLC cells.

Figure 3A:
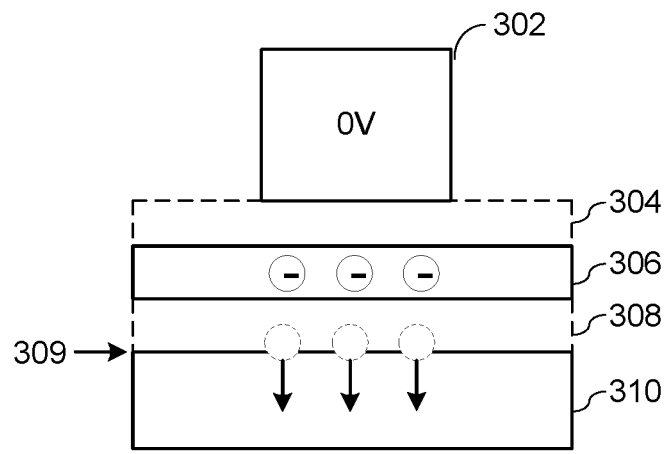
FIGS. 3A-3B are diagrams of a memory cell in first read and second read states in accordance with some embodiments.
Figure 3B:
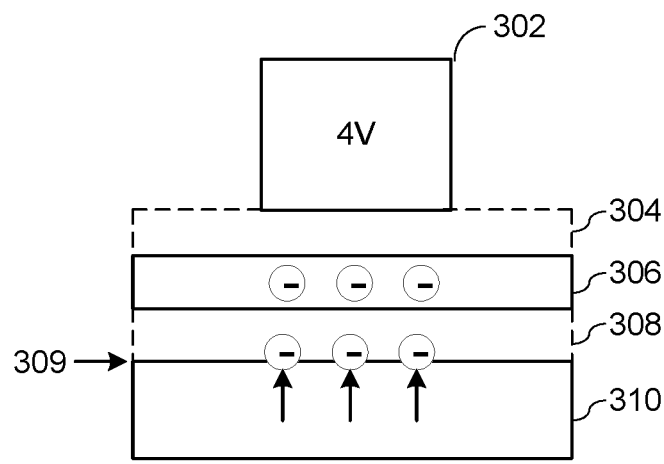

FIGS. 3A-3B illustrate two states of a memory cell (e.g., cell 208 in FIG. 2) in accordance with some embodiments. The memory cell includes a control gate 302, a floating gate 306, and a conducting channel 310. In some implementations (e.g., 3D NAND), the floating gate 306 is referred to as a charge trap layer, and the conducting channel is referred to as a memory hole. The memory cell also includes a tunnel oxide layer 308 disposed between the floating gate 306 and conducting channel 310, and a gate oxide layer 304 disposed between the control gate 302 and floating gate 306.

During a read operation, a read voltage is applied to the control gate 302. If the floating gate 306 is programmed (i.e., electrons are present in the floating gate), a current will not flow in the conducting channel 310, which is interpreted as logic 0. If the floating gate 306 is erased (i.e., electrons are mostly not present in the floating gate), a current will flow in the conducting channel 306, which is interpreted as logic 1. For MLC and TLC memory, an amount of current is measured for successively applied read voltages to determine which logic is represented (e.g., 11, 10, 01, 00 for MLC).

During a write operation, a high voltage (e.g., 12V) is applied to the control gate 302, which pulls electrons from the conducting channel 310 into the floating gate 306. The electrons enter the floating gate 306 by escaping the conducting channel 310 and tunneling through the oxide 308.

The memory cell may be in a state 300 referred to as "first read" (also referred to as first read condition or first read mode). The first read state may occur due to static charge leakage at the cell that, when subsequently read, results in an error. In these scenarios, a read disturb error may result, referred to as a "first read read disturb." Stated another way, when the memory cell is in a first read condition, this condition may cause a read disturb error. The first read state 300 may be caused by a number of factors, including an initialization event such as a power on or waking up event in the memory device, high temperatures (which cause the cell to slowly become programmed over time), and/or the amount of time between reads, among other factors. If the cell has not been read for a threshold amount of time, the probability that the cell will be in the first read condition rises. If the memory cell has recently been read, the cell may be in a state 350 referred to as "second read" (also referred to as second read condition or second read mode).

In the first read state (see FIG. 3A), there is no electric field (0V) at the control gate 302. As such, there are no electrons (or an immaterially low number of electrons) present at the interface 309 between the conducting channel 310 and the tunneling oxide 308. As a result, electrons in the floating gate 306 do not see a barrier to diffuse back to the conducting channel 310. This charge leakage increases the bit error rate (BER) with respect to the memory cell. Therefore, the first read state is undesirable. The tighter the read margin (e.g., the space between distributions E and A in FIG. 4A), the more undesirable the first read state is. Therefore, since MLC and TLC have tighter read margins than SLC, the first read state has a more negative affect on MLC and TLC than on SLC.

In some implementations, the storage controller may maintain a weak electric field (e.g., 4V) at the control gate in order to keep the memory cell in the second read state (see FIG. 3B). This field is enough to pull some electrons in the conducting channel 310 to the interface 309. As such, the electrons in the floating gate 306 see a barrier that makes it more difficult to diffuse. Stated another way, the electrons at the interface 309 create a repulsive force that makes it more difficult for the electrons in the floating gate 306 to escape back to the conducting channel 310. Stated yet another way, the second read state prevents programmed electrons from detrapping.

Since memory cells respond differently (e.g., to read voltages) based on whether the cells are in the first read or second read state, it is preferable to keep the cells in one state or the other, thus minimizing errors. Since the first read state negatively affects MLC and TLC, it is advantageous to keep the memory cells in the second read state. In some embodiments, the controller 124 causes a read refresh operation to regularly be applied to the memory cells in order to keep them in the second read state. More details regarding the read refresh operation are disclosed below.

Figure 4B:
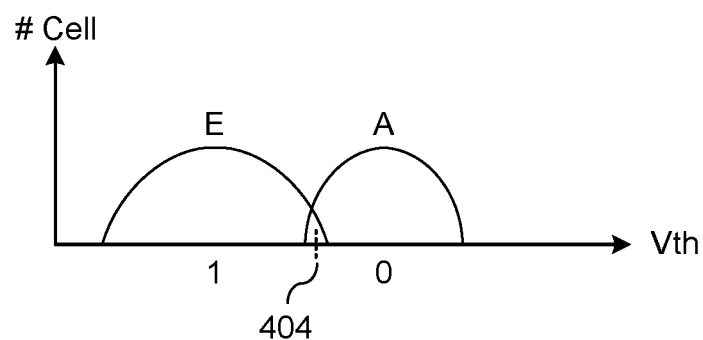

While in the second read state, the weak bias at the control gate (e.g., 4V) is generally too weak to move electrons from the channel 310 to the floating gate 306. However, if the voltage is held long enough (e.g., for 10 hours, 100 hours, or more), some of the electrons at the interface 309 will eventually be pulled into the floating gate. This causes the oxide barrier at the interface 309 to degrade over time, which leads to more trap sites at the interface 309, which leads to even more electrons being pulled into the floating gate. As time goes on, the memory cell becomes easier to program, and given enough time, an erased cell will flip to a programmed cell due to enough electrons being present in the floating gate to prevent a current from flowing in the channel 310 during a read operation. This behavior negatively affects the memory cell's endurance (also referred to as data retention). An example of this behavior is illustrated in FIG. 4B, which shows an overlap in the erase and program distributions in the region of threshold voltage 404. The bigger the overlap, the higher the error rate.

In order to prevent memory cells from losing endurance due to the behavior described above (i.e., constant application of the weak voltage while in the second read state causing an abundance of trap sites at the oxide interface), it becomes necessary to change the read behavior of the memory cell. One way to change the read behavior is to adjust the conditions of the cell so that they more closely resemble the first read condition. As such, the weak voltage at the control gate, a characteristic of the second read state, is removed. Adaptively adjusting read conditions (e.g., read trim time) throughout the life of the memory cells allows the cells to take advantage of second read conditions (lower bit-error rates, higher reliability) in beginning-of-life (BOL), while gradually shifting to conditions that preserve reliability in middle-of-life (MOL) and end-of-life (EOL).

In some implementations, when shifting read conditions, SLC, MLC, and TLC are treated differently due to their different properties. For instance, since MLC and TLC are rarely rated for endurance levels that are long enough to be affected by the constant application of weak voltage in the second read state, some implementations described herein do not adaptively shift read conditions for MLC and TLC. Instead, these implementations only adaptively shift read conditions for SLC. However, other implementations may adaptively shift read conditions for all types of cells, depending on each cell type's rated endurance level, compared to how long it takes for second read conditions to negatively impact the cell's ability to be programmed as described above.

In some implementations, memory cell endurance is measured in erase cycles or counts. Alternatively, memory cell endurance is measured in program cycles or counts. Depending on the application, memory cells are rated for different endurance levels. For example, low endurance memory may be selected to store program code which rarely needs to be updated, while high endurance memory may be selected for use in a memory card meant for more frequent programming. In some implementations, memory cell endurance is classified into categories. For example, a cell or an array of cells may be classified in a beginning-of-life (BOL) classification if the number of erase cycles for the cell is below a first predetermined threshold (e.g., less than 50,000 erase cycles less). A cell or an array of cells may be classified in a middle-of-life (MOL) classification if the number of erase cycles for the cell is between the first predetermined threshold and a second predetermined threshold (e.g., between 50,000 and 100,000 erase cycles). A cell or an array of cells may be classified in an end-of-life (EOL) classification if the number of erase cycles for the cell is greater than the second predetermined threshold (e.g., greater than 100,000 erase cycles). Other classifications are contemplated, such as two or more MOL classifications with successive thresholds between BOL and EOL thresholds of erase cycles, and/or beyond-EOL classifications with successive thresholds greater than the EOL threshold.

As described above, a memory cell is read by applying a read voltage to the control gate for a certain amount of time (also referred to herein as "read time"). By adjusting read conditions (e.g., read voltage and read time) to account for EOL reliability issues as described above, various aspects of the read operation may be modified. In general, these aspects are controlled based on the read trim. Specifically, the read trim specifies read factors including one or more of (i) the time it takes for a read circuit to ramp up the read voltage to the read voltage level ("ramp-up time"), (ii) the time it takes for a read circuit to wait for the read voltage level to stabilize before sensing current in the conducting channel ("voltage stabilization time"), (iii) the time it takes for a read circuit to sense current in the conducting channel after the read voltage is stabilized ("sense time"), (iv) the time it takes for a read circuit to discharge the read voltage after the sensing operation is complete ("discharge time"), and/or (v) the read voltage level. The read trim may control any one of these factors, or any combination of these factors. For example, the read trim my control the entire read cycle (including ramp-up, stabilization, sense, and discharge times), or the read trim may control only the sense time.

FIG. 5 is a table of read trim values grouped by memory life cycle. In some implementations, the table is stored in memory 123 and accessed by read trim module 142 in setting a read trim for a selectable portion 131 of memory (such as a block 200 of memory, or a subset thereof). The values in the table are examples; other values are contemplated depending on the physical characteristics of the memory cell, as described above with respect to end-of-life behavior. In this example, a particular class of memory cells (e.g., SLC) is grouped into a BOL classification (group 0) if the cells have been erased between 1 and 50,000 times. One or more MOL classifications include erase counts between 50,000 and 75,000, and an EOL classification (group N) includes erase counts between 75,000 and 100,000. Each classification is assigned a predetermined read trim value (e.g., X, X+1, X+2, and so forth, wherein X is one or more of the read time or voltage values described above) as a function of a particular life cycle (group 0 through group N).

Figure 6:
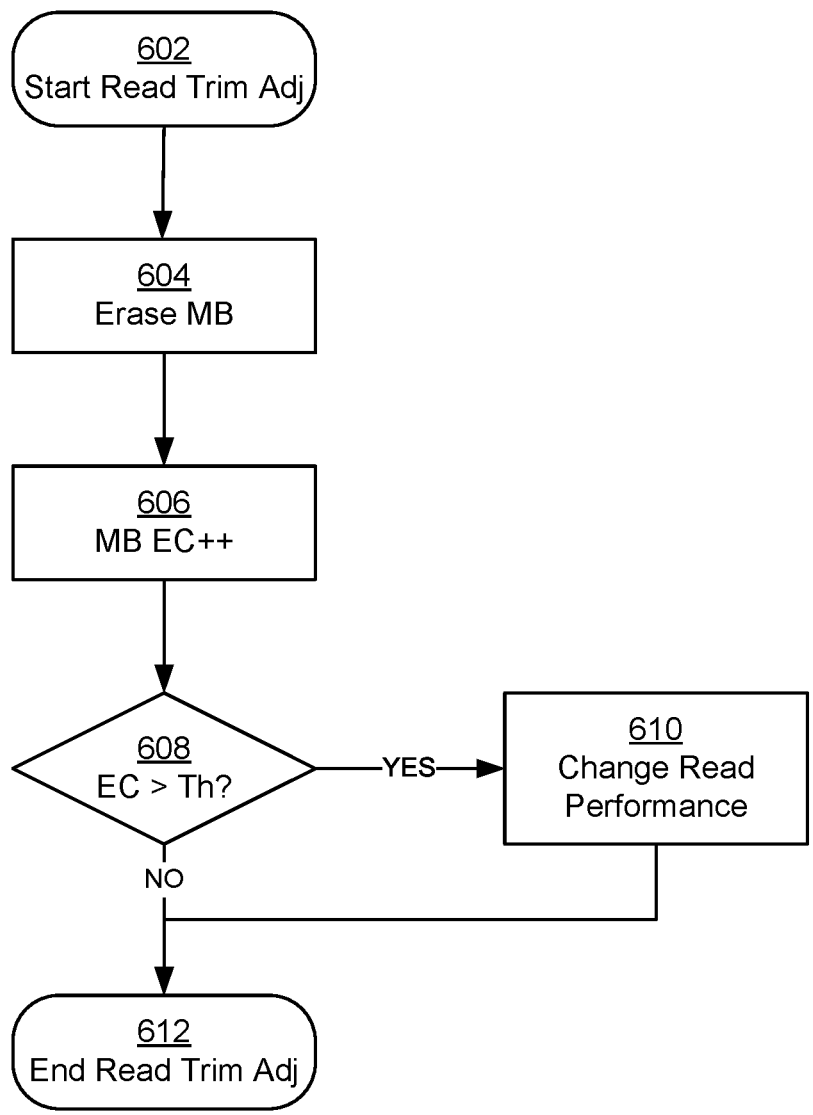
FIG. 6 is a flowchart of a method of adaptively adjusting read in accordance with some embodiments.

FIG. 6 depicts a flowchart of a method 600 of dynamically adjusting read trim of one or more memory cells in accordance with some embodiments. Method 600 is typically performed by the storage controller 124 or management module 121 of a storage device 120 or storage system, for example under the control of a read trim module 142, but alternatively may be performed by a computer system (e.g., computer system 110) in which a storage device is embedded.

The controller runs (602) the method while the storage device is powered on. In some implementations, at the moment the device is powered on, the controller first checks a table (e.g., table 500) to determine if the current read trim value (e.g., read time) is different than the one stored in the table, and loads the value from the table in accordance with a determination that the table value is different.

During runtime (i.e., while the storage device is powered on and running), every time a metablock of memory is erased (604), the controller increments an erase counter (606) for that block. While this and other examples refer to metablocks (groups of blocks) of memory, other groupings of memory cells are contemplated, such as strings, pages, and blocks.

The controller compares (608) the erase count to one or more thresholds to determine an endurance level, optionally as specified by a trim group for the metablock, as described above with reference to read trim table 500 in FIG. 5.

If the erase count exceeds a threshold, then the controller adjusts (610) the read performance for the metablock in accordance with the erase count. In some implementations, adjusting the read performance includes adjusting a read performance characteristic or read performance profile (i.e., multiple characteristics). In some implementations, the read performance profile includes one or more read trim values. In some implementations, adjusting the read performance in response to an increased erase count includes increasing one or more of the read trim values (e.g., read time, read voltage) to mitigate maintaining a metablock in a second read state where bit error rate at higher erase counts (e.g., MOL or EOL) is greater than when a metablock is maintained in a corresponding first read state at these higher erase counts. In some implementations, adjusting the read performance includes increasing one or more of the read trim values for an EOL condition only, or for MOL and EOL conditions only. For example, if the erase count is above an EOL threshold (e.g., 75,000 in FIG. 5), the controller adjusts the read trim (e.g., increases a read time of the read performance profile for the block) in accordance with the specification for the EOL classification (e.g., X+2 for group N in FIG. 5). In some implementations, the controller tests for multiple thresholds at this step in order to determine a specific life cycle classification among a plurality of life cycle classifications, as described above with reference to FIG. 5. For example, the controller compares the erase count to each threshold in table 500. Alternatively, the controller compares the erase count to only a first threshold (e.g., 50,000), and once that threshold is exceeded, the controller compares the erase count to only a second threshold (e.g., 75,000) until that threshold is exceeded. As such, a subsequently received read command for the metablock is executed using the new read trim value(s), and the read trim adjustment for the metablock is complete (612) until the next erase command is received for the metablock.

Returning to operation 608, if the erase count does not exceed the threshold, then the controller completes (612) the read trim adjustment method for the metablock that was erased, without changing the read performance. As such, a subsequently received read command for the metablock is executed using the unadjusted read trim value(s).

From a different perspective, the controller receives a read command from a computer system 110 (FIG. 1). The read command specifies data to be read from storage medium 130, such as by specifying a logical or physical address. In some embodiments, the controller, in response to the read command, controls a process of accessing and decoding the specified data so as to produce decoded data. At least part of the accessing and decoding process is described in more detail above (e.g., applying read voltages). In response to the read command, the controller applies one or more read voltage in accordance with a read trim specified in controller memory 123 (e.g., in table 500). For example, the controller applies a read voltage using a read time specified in table 500.

While the operations above are performed based on erase counts, it is also contemplated that the operations are performed based on program counts, program-erase cycle counts, or any other count that indicates the life cycle of a memory cell at the time of a particular read, program, or erase operation.

While table 500 includes example read trim adjustments for BOL, MOL, and EOL, it is contemplated that some implementations do not adjust the read trim until EOL (or a life cycle stage that is close to EOL, such as an MOL stage or a beyond-EOL stage). That way, the storage device takes advantage of the high performance characteristics associated with the second-read state at a time that the negative implications associated with the second-read state (described above) do not yet substantially affect data retention of memory cells. Instead, by adjusting read trim values closer to EOL, performance is not sacrificed until it is necessary to preserve data retention (i.e., reliability) of the memory cells.

It is further contemplated that table 500, in some implementations, includes adjustments for only certain types of memory (e.g., only for SLC), or includes different adjustments for the different types of memory (e.g., first adjustments for SLC, second adjustments for MLC, and so forth). Alternatively, table 500 is not limited to only certain types of memory, and instead, the controller (e.g., read trim module) only implements method 600 for certain types of memory (e.g., only for SLC). Alternatively, table 500 is not limited to only certain types of memory, and the controller implements method 600 for all types of memory, but since MLC and TLC are typically not rated for the endurance levels designated by the various thresholds, these types of memory are not affected by the method 600.

As described above, one way to address first read issues is to place memory cells into a second read condition before attempting to read the cell. For example, a memory controller may send a pre-conditioning command prior to a read command, or in regular intervals (e.g., every three minutes, or more than three minutes, or less than three minutes), regardless of whether a read command is received, to apply a pre-conditioning voltage to a plurality of word lines in a block in order to move the memory cells into, or keep the memory cells in, the second read condition. This pre-conditioning command is referred to herein as a refresh command, or a refresh read command. Specifically, "refresh read" may refer to a particular prefix command sent prior to the actual read command being applied to the memory (e.g., in regular intervals, such as three minutes). More generally, the command can be referred to as a command that indicates that there is a pre-conditioning step used to put an entire metablock, or an entire block into the second read mode. In such cases, there may be two separate refresh read commands: a first type of refresh command that refreshes a metablock (a group of blocks), and a second type of refresh command that refreshes only one block.

Figure 7:
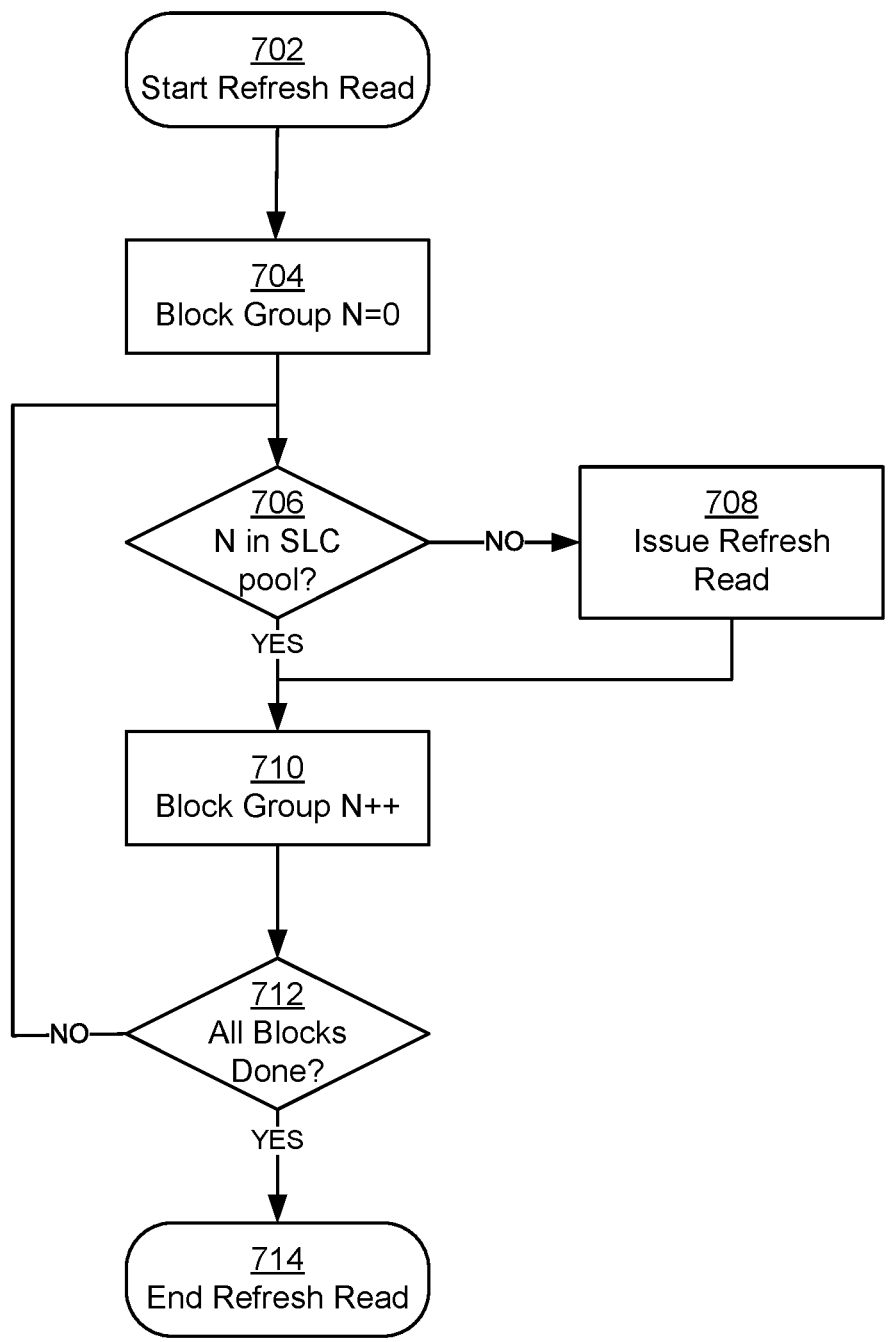
FIG. 7 is a flowchart of a method of issuing refresh read commands in accordance with some embodiments.

FIG. 7 depicts a flowchart of a method 700 of selectively issuing refresh read commands for one or more memory cells (e.g., for a metablock or for a block) in accordance with some embodiments. Method 700 is typically performed by the storage controller 124 or management module 121 of a storage device 120 or storage system, for example under the control of a refresh module 144, but alternatively may be performed by a computer system (e.g., computer system 110) in which a storage device is embedded.

The controller initiates (702) a refresh command to maintain a particular block or group of blocks in a second read state. In some implementations, the command specifies a particular block or group of blocks. Alternatively, the command does not specify a block, and instead refreshes each block or group of blocks using a predetermined order. For example, the refresh command is first applied (704) to a block group N=0. While it is contemplated that other groupings of memory cells are possible (e.g., blocks, pages, strings, and so forth), this example refers only to groups of blocks (metablocks) for the sake of brevity, and so as not to obscure more pertinent aspects of the example implementations. The controller determines (706) if a first type of memory cell is present in the block group. For example, the controller determines if any SLC memory cells are present in the block group. In some implementations, the controller determines if any SLC memory cells are present in the block group by referencing an SLC pool (i.e., a listing of all blocks or block groups which include SLC memory cells).

If the block group does not include any memory cells of the first type (e.g., no SLC memory cells), the controller (708) issues the refresh read command for the entire block group (e.g., the first type of refresh command described above).

If the block group does include one or more memory cells of the first type (e.g., SLC memory cells), the controller forgoes issuing the refresh read command for the entire block group. In some implementations, the controller moves on (710) to the next block group, and if all block groups have been addressed (712), the refresh read is complete (714).

In some implementations, before moving on to the next block group, the controller checks each individual block in the block group for memory cells of the first type (e.g., SLC), and applies a refresh command to each block that does not contain memory cells of the first type (e.g., the second type of refresh command as described above). By refreshing metablocks by default, and only refreshing individual blocks in a particular metablock if the particular metablock is found to include an SLC cell, the controller can more efficiently refresh each block in the memory 130 while foregoing refreshing blocks of a certain type (e.g., SLC) that are maintained in first read state for endurance reasons (e.g., by using adaptive read trim as shown in FIG. 6).

As discussed above, it may be advantageous to keep all memory cells in the second read state while the cells are not negatively affected by this state (e.g., during BOL), and only adjust the read characteristics for the cells to resemble first-read characteristics as the life cycle advances (e.g., close to and including EOL). As such, in some implementations, refresh commands are applied to all metablocks, regardless of their contents, until a certain life cycle threshold (e.g., MOL or EOL) is reached, at which method 700 is used to selectively refresh only the blocks that do not include SLC cells. That way, SLC cells may remain in the first read state, thereby preserving data retention, without constantly being refreshed to the second read state due to the refresh commands being issued by the controller.

It will be understood that, although the terms "first," "second," etc. may be used herein to describe various elements, these elements should not be limited by these terms. With the exception of the phrases "first read condition" and "second read condition," the terms "first," "second," etc. are only used to distinguish one element from another. For example, a first contact could be termed a second contact, and, similarly, a second contact could be termed a first contact, without changing the meaning of the description, so long as all occurrences of the "first contact" are renamed consistently and all occurrences of the second contact are renamed consistently. The first contact and the second contact are both contacts, but they are not the same contact.

The phrases "first read condition" and "second read condition" describe art-recognized conditions of memory cells, the conditions being labeled "first read" (e.g., the first time a cell is being read after a threshold amount of time, or after powering on the memory device) and "second read" (e.g., a read operation that produces more accurate results due to the cell having been read before a threshold amount of time has passed, or due to the memory device having already been powered on). In general, these phrases are not interchangeable without changing the meaning of the element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A data storage system, comprising a memory comprising a plurality of memory cells; and a controller in communication with the memory, the controller configured to:
   determine an endurance level of a block of memory cells of the plurality of memory cells;
   increase at least one of a read voltage ramp-up time, a read voltage stabilization time, a read voltage sense time, and/or a read voltage discharge time for the block of memory cells based on the determined endurance level;
   receive a data read command specifying data to be read from a particular memory cell of the block of memory cells; and
   in response to the data read command, perform a read operation on the particular memory cell using the increased read voltage ramp-up time, read voltage stabilization time, read voltage sense time, and/or read voltage discharge time.

2. The data storage system of claim 1, wherein the controller being configured to determine the endurance level of the block of memory cells includes the controller being configured to:
   increment an erase count associated with the block of memory cells each time the block of memory cells is erased; and
   determine the endurance level based on the erase count.

3. The data storage system of claim 1, wherein the controller being configured to determine the endurance level of the block of memory cells includes the controller being configured to:
   compare an erase count associated with the block of memory cells with one or more erase count thresholds associated with beginning-of-life (BOL), middle-of-life (MOL), end-of-life (EOL), and beyond end-of-life (BEOL) classifications of the block of memory cells; and
   determine the endurance level based on the comparison.

4. The data storage system of claim 1, wherein the controller being configured to determine the endurance level of the block of memory cells includes the controller being configured to:
   determine an erase count of one or more of the memory cells of the block of memory cells; and
   determine the endurance level based on the erase count.

5. The data storage system of claim 1, wherein the controller being configured to increase at least one of the read voltage ramp-up time, read voltage stabilization time, read voltage sense time, and/or read voltage discharge time for the block of memory cells based on the determined endurance level includes the controller being configured to:
   determine whether the determined endurance level is associated with an EOL classification; and
   in accordance with a determination that the determined endurance level is associated with the EOL classification, increase at least one of the read voltage ramp-up time, read voltage stabilization time, read voltage sense time, and/or read voltage discharge time for the block of memory cells.

6. The data storage system of claim 1, wherein the controller being configured to increase at least one of the read voltage ramp-up time, read voltage stabilization time, read voltage sense time, and/or read voltage discharge time for the block of memory cells based on the determined endurance level includes the controller being configured to:
   set at least one of the read voltage ramp-up time, read voltage stabilization time, read voltage sense time, and/or read voltage discharge time to a first value in accordance with a determination that the determined endurance level is associated with a MOL classification; and
   increase at least one of the read voltage ramp-up time, read voltage stabilization time, read voltage sense time, and/or read voltage discharge time to a second value in accordance with a determination that the determined endurance level is associated with an EOL classification.

7. A data storage system, comprising a memory comprising a plurality of memory cells; and a controller in communication with the memory, the controller configured to:
   in response to receiving a refresh read command, for each metablock of the plurality of memory cells:
   determine an endurance level of the metablock;
   compare the determined endurance level to a predetermined life cycle threshold;
   in accordance with a determination that the determined endurance level exceeds the predetermined life cycle threshold:
   determine whether the metablock includes any single level cell (SLC) memory cells; and
   in accordance with a determination that the metablock does not include any SLC memory cells, perform a refresh read operation on the metablock; and
   in accordance with a determination that the metablock includes an SLC memory cell, forgo performing the refresh read operation on the metablock, and perform a second refresh read operation on one or more blocks within the metablock which do not include any SLC memory cells.

8. The data storage system of claim 7, wherein the controller is further configured to:
in accordance with a determination that the determined endurance level does not exceed the predetermined life cycle threshold, perform the refresh read operation on the metablock.

9. The data storage system of claim 7, wherein the controller being configured to determine whether the metablock includes any SLC memory cells includes the controller being configured to search for the metablock in a listing of metablocks that include SLC memory cells.

10. The data storage system of claim 7, wherein the controller being configured to perform the refresh read operation on the metablock includes the controller being configured to:
apply a pre-conditioning voltage to a plurality of word lines in the metablock in order to move the memory cells into, or keep the memory cells in, a second read condition.

11. A data storage system, comprising:
means for determining an endurance level of a block of memory cells;
means for increasing at least one of a read voltage ramp-up time, a read voltage stabilization time, a read voltage sense time, and/or a read voltage discharge time for the block of memory cells based on the determined endurance level;
means for receiving a data read command specifying data to be read from a particular memory cell of the block of memory cells; and
means for, in response to the data read command, performing a read operation on the particular memory cell using the increased read voltage ramp-up time, read voltage stabilization time, read voltage sense time, and/or read voltage discharge time.

12. A method for a data storage system, comprising a memory comprising a plurality of memory cells; and a controller in communication with the memory, the method comprising:
at the controller:
determining an endurance level of a block of memory cells of the plurality of memory cells;
increase at least one of a read voltage ramp-up time, a read voltage stabilization time, a read voltage sense time, and/or a read voltage discharge time for the block of memory cells based on the determined endurance level;
receiving a data read command specifying data to be read from a particular memory cell of the block of memory cells; and
in response to the data read command, performing a read operation on the particular memory cell using the increased read voltage ramp-up time, read voltage stabilization time, read voltage sense time, and/or read voltage discharge time.

13. The method of claim 12, wherein determining the endurance level of the block of memory cells includes:
incrementing an erase count associated with the block of memory cells each time the block is erased; and
determining the endurance level based on the erase count.

14. The method of claim 12, wherein determining the endurance level of the block of memory cells includes:
comparing an erase count associated with the block of memory cells with one or more erase count thresholds associated with beginning-of-life (BOL), middle-of-life (MOL), end-of-life (EOL), and beyond end-of-life (BEOL) classifications of the block of memory cells; and
determining the endurance level based on the comparison.

15. The method of claim 12, wherein determining the endurance level of the block of memory cells includes:
determining an erase count of one or more of the memory cells of the block of memory cells; and
determining the endurance level based on the erase count.

16. The method of claim 12, wherein increasing at least one of the read voltage ramp-up time, read voltage stabilization time, read voltage sense time, and/or read voltage discharge time for the block of memory cells based on the determined endurance level includes:
determining whether the determined endurance level is associated with an EOL classification; and
in accordance with a determination that the determined endurance level is associated with the EOL classification, increasing at least one of the read voltage ramp-up time, read voltage stabilization time, read voltage sense time, and/or read voltage discharge time for the block of memory cells.

17. The method of claim 12, wherein increasing at least one of the read voltage ramp-up time, read voltage stabilization time, read voltage sense time, and/or read voltage discharge time for the block of memory cells based on the determined endurance level includes:
setting at least one of the read voltage ramp-up time, read voltage stabilization time, read voltage sense time, and/or read voltage discharge time to a first value in accordance with a determination that the determined endurance level is associated with a MOL classification; and
increasing at least one of the read voltage ramp-up time, read voltage stabilization time, read voltage sense time, and/or read voltage discharge time to a second value in accordance with a determination that the determined endurance level is associated with an EOL classification.

* * * * *